United States Patent
Garmon et al.

(10) Patent No.: US 10,833,568 B2
(45) Date of Patent: Nov. 10, 2020

(54) GENERATOR GROUNDING STRAP MODULE

(71) Applicant: SIEMENS ENERGY, INC., Orlando, FL (US)

(72) Inventors: Michael D. Garmon, Orlando, FL (US); Justin Nathaniel England, Winter Springs, FL (US); Thomas I. Nelson, Oviedo, FL (US); Kim M. McCreight, Oviedo, FL (US); Timothy J. Garner, Winter Springs, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 169 days.

(21) Appl. No.: 16/267,976

(22) Filed: Feb. 5, 2019

(65) Prior Publication Data

US 2020/0251967 A1 Aug. 6, 2020

(51) Int. Cl.
*H02K 11/40* (2016.01)
*H02K 11/20* (2016.01)
(Continued)

(52) U.S. Cl.
CPC ............ *H02K 11/40* (2016.01); *G01R 31/50* (2020.01); *H01R 39/58* (2013.01); *H02K 11/20* (2016.01)

(58) Field of Classification Search
CPC ..................................................... H02K 11/40
(Continued)

(56) References Cited

U.S. PATENT DOCUMENTS

| 4,563,675 A | 1/1986 | Miller et al. |
| 4,873,512 A | 10/1989 | Miller |

(Continued)

FOREIGN PATENT DOCUMENTS

| CZ | 10345 U1 | 8/2000 | | |
| EP | 0822417 | * 2/1998 | ............. | G01R 31/06 |

(Continued)

OTHER PUBLICATIONS

PCT International Search Report and Written Opinion dated Apr. 30, 2020 corresponding to PCT Application No. PCT/US2020/015141 filed Jan. 27, 2020.

*Primary Examiner* — Stanely Tso

(57) ABSTRACT

A generator grounding module selectively mountable to a support bracket and selectively engageable with a rotor includes a plate member movable along a mounting axis to selectively attach the generator grounding module to the support bracket, the plate member movable between a first position and a second position in which the plate member is substantially fixed with respect to the support bracket. A mounting block is movable along the mounting axis with respect to the plate member, a grounding strap is coupled to the mounting block and is movable between a disengaged position and an engaged position in which the grounding strap contacts the rotor, and a biasing assembly is connected to the plate member and the mounting block and operable to bias the mounting block along the mounting axis toward the plate member, wherein the plate member is fixedly attached to the support bracket when in the second position and the biasing assembly biases the grounding strap into the engaged position.

18 Claims, 14 Drawing Sheets

(51) Int. Cl.
*G01R 31/50* (2020.01)
*H01R 39/58* (2006.01)

(58) Field of Classification Search
USPC .......................................................... 174/5 SG
See application file for complete search history.

(56) References Cited

U.S. PATENT DOCUMENTS

| | | | |
|---|---|---|---|
| 5,233,499 A | 8/1993 | Twerdochlib | |
| 9,910,093 B2 | 3/2018 | Thompson et al. | |
| 2007/0159763 A1* | 7/2007 | Barnard | H01R 39/64 |
| | | | 361/212 |
| 2009/0236142 A1* | 9/2009 | Anliker | B02C 19/18 |
| | | | 174/5 SG |
| 2012/0132482 A1* | 5/2012 | Koma | F16C 33/6622 |
| | | | 184/5.1 |
| 2014/0008481 A1* | 1/2014 | Slezak | B65H 59/04 |
| | | | 242/421 |
| 2018/0351439 A1* | 12/2018 | Jahnke | G01R 19/25 |
| 2019/0190352 A1* | 6/2019 | Miyaji | H02K 11/40 |

FOREIGN PATENT DOCUMENTS

| | | | |
|---|---|---|---|
| EP | 0822417 A2 | 2/1998 | |
| GB | 08640 | * | 3/1913 |
| GB | 191208640 A | 3/1913 | |

* cited by examiner

GENERATOR GROUNDING STRAP MODULE

TECHNICAL FIELD

The present disclosure is directed, in general, to a modular assembly for a generator grounding strap, and more specifically to a modular grounding strap including redundant straps and sensors.

BACKGROUND

Large rotating shafts, such as those seen in generators must be continuously grounded to prevent damage to shaft bearings from electrical charges that may build up in the shaft or rotor during operation. The shaft itself rides on a thin film of oil or other suitable lubricant in a pair of bearings, and accordingly is electrically insulated from ground potential. However, the buildup of an excessive electrical charge on the shaft can cause a discharge through the oil film, resulting in damage to the bearings. To prevent such a discharge, and to ground the rotating shaft, shaft grounding devices (SGD) are placed in continuous contact with the rotating shaft as it rotates to provide a discharge path to ground.

SUMMARY

A generator grounding module selectively mountable to a support bracket and selectively engageable with a rotor includes a plate member movable along a mounting axis to selectively attach the generator grounding module to the support bracket, the plate member movable between a first position and a second position in which the plate member is substantially fixed with respect to the support bracket. A mounting block is movable along the mounting axis with respect to the plate member, a grounding strap is coupled to the mounting block and is movable between a disengaged position and an engaged position in which the grounding strap contacts the rotor, and a biasing assembly is connected to the plate member and the mounting block and operable to bias the mounting block along the mounting axis toward the plate member, wherein the plate member is fixedly attached to the support bracket when in the second position and the biasing assembly biases the grounding strap into the engaged position.

In another construction, a generator grounding module is selectively mountable to a support bracket and is selectively engageable with a rotor and includes a mounting block movable along a mounting axis with respect to the support bracket, a first grounding strap, a second grounding strap, and an attachment assembly operable to connect the first grounding strap and the second grounding strap to the mounting block, the mounting block movable between a disengaged position and an engaged position in which the first grounding strap contacts the rotor and the second grounding strap is spaced apart from the rotor. A biasing assembly is connected to the support bracket and the mounting block and is operable to bias the mounting block along the mounting axis toward the rotor, wherein the biasing assembly biases the first grounding strap into the engaged position.

In another construction, a generator grounding module is selectively mountable to a support bracket and is selectively engageable with a rotor, the generator grounding module includes a plate member, a mounting block, a first grounding strap, a second grounding strap, and a biasing assembly connected to the plate member and the mounting block to generate a constant biasing force to bias the mounting block and the plate member toward one another. An attachment assembly is operable to connect the first grounding strap and the second grounding strap to the mounting block. A handle, the plate member, mounting block, first grounding strap, second grounding strap, biasing assembly, attachment assembly, and handle are movable as a unit along a mounting axis from a free position to a contact position at which the first grounding strap contacts the rotor, the handle movable to a locking position in which the biasing assembly generates a first biasing force that engages the first grounding strap and the rotor and the attachment assembly generates a second biasing force that balances the first biasing force, and wherein failure of the first grounding strap reduces the second biasing force and moves the second grounding strap into engagement with the rotor.

In another construction, a method of installing a generator grounding module includes attaching a first grounding strap and a second grounding strap to a mounting block, attaching the mounting block to a plate member, and biasing the mounting block toward the plate member with a biasing member, the first grounding strap, second grounding strap, mounting block, plate member, and biasing member defining a unit. The method further includes attaching the unit to a fixed support bracket, the unit movable along a mounting axis with respect to the support bracket, moving the unit into an engaged position in which the first mounting strap engages a rotor and applies a first biasing force to the mounting block to bias the mounting block away from the plate member, and applying a second biasing force to the mounting block with the biasing member, the second biasing force and the first biasing force balancing one another.

The biasing member produces the second biasing force and wherein the second biasing force is constant when the unit is between the engaged position and a disengaged position.

The method may also include sensing movement of the mounting block from the engaged position in response to a failure of one or both of the first grounding strap and the second grounding strap.

The method may further include connecting a handle to the plate member, moving the plate member along the mounting axis by moving the handle along the mounting axis to position the plate member in a locking position, and rotating the handle about the mounting axis to fixedly attach the plate member to the block member.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this specification and those of ordinary skill in the art will understand that such definitions apply in many, if not most, instances to prior as well as future uses of such defined words and phrases.

While some terms may include a wide variety of embodiments, the appended claims may expressly limit these terms to specific embodiments.

Figure 1:
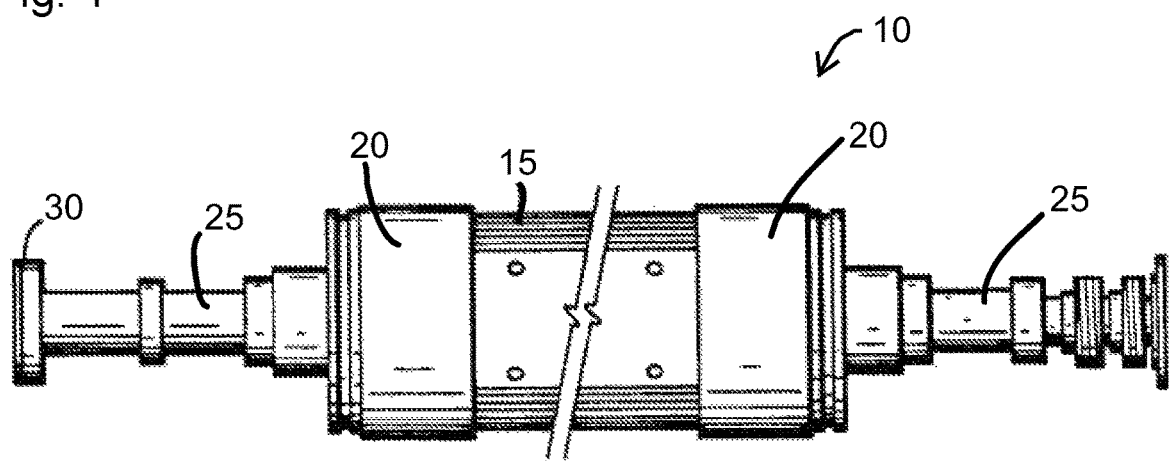
FIG. 1 is a side view of a generator rotor.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Various technologies that pertain to systems and methods will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

Also, it should be understood that the words or phrases used herein should be construed broadly, unless expressly limited in some examples. For example, the terms "including," "having," and "comprising," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to refer to various elements, information, functions, or acts, these elements, information, functions, or acts should not be limited by these terms. Rather these numeral adjectives are used to distinguish different elements, information, functions or acts from each other. For example, a first element, information, function, or act could be termed a second element, information, function, or act, and, similarly, a second element, information, function, or act could be termed a first element, information, function, or act, without departing from the scope of the present disclosure.

In addition, the term "adjacent to" may mean: that an element is relatively near to but not in contact with a further element; or that the element is in contact with the further portion, unless the context clearly indicates otherwise. Further, the phrase "based on" is intended to mean "based, at least in part, on" unless explicitly stated otherwise. Terms "about" or "substantially" or like terms are intended to cover variations in a value that are within normal industry manufacturing tolerances for that dimension. If no industry standard as available, a variation of 20 percent would fall within the meaning of these terms unless otherwise stated.

FIG. 1 illustrates a generator rotor 10 of the type commonly used in large-scale power generation such as at fossil fuel fired plants, nuclear plants, and the like. The rotor 10 includes an elongated central portion 15 into which coils are placed to define one or more windings. Each end includes a retaining ring 20 positioned to support and restrain the ends of the windings. The rotor 10 extends beyond the central portion 15 in both directions to define bearing surfaces 25 where bearings engage and support the rotor 10 for rotation as well as other surfaces and features required for proper operation of the rotor 10. One or more couplings 30 are provided at each end to connect the rotor 10 to other rotating equipment such as a gas turbine engine, a steam turbine, a hydro turbine, a wind turbine, and the like. A stator, and other stationary components 35, surround the rotor 10 and remain substantially stationary during rotor operation.

Figure 2:
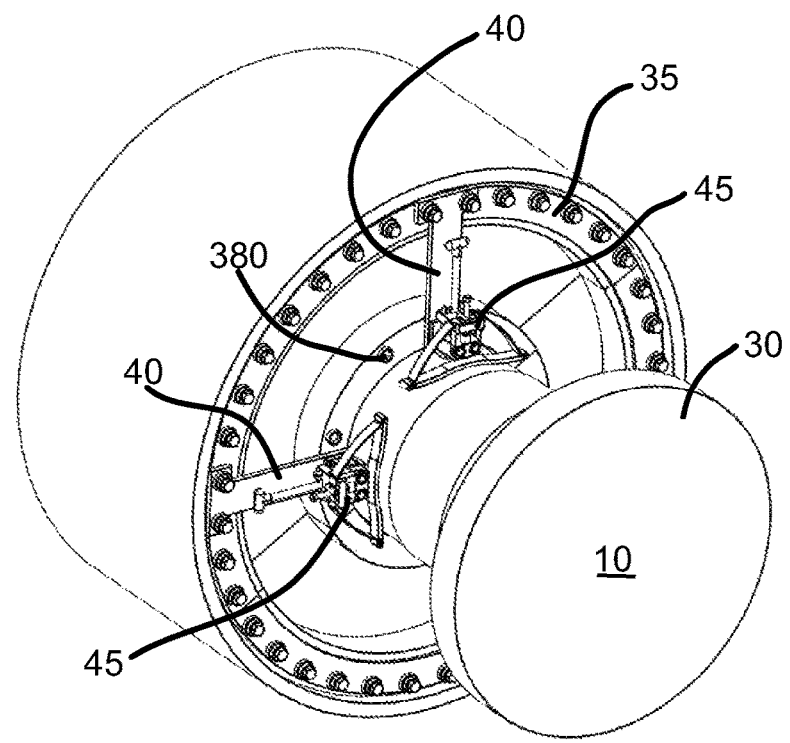
FIG. 2 is a perspective view of a generator grounding strap module attached to a stationary component adjacent the rotor of FIG. 1.

Turning to FIG. 2, a perspective end view better illustrates two support brackets 40 attached to a stationary component 35 positioned near the rotor 10 and including two generator grounding modules 45 (sometimes referred to as generator grounding strap modules) each attached to one of the two support brackets 40. The stationary component 35 could be a bearing housing, a stator housing, a generator housing, a seal housing, and the like. As should be evident, a single generator grounding module 45, or more than two grounding modules 45 could be employed at one end, or both ends of the rotor 10 as may be required.

Figure 3:
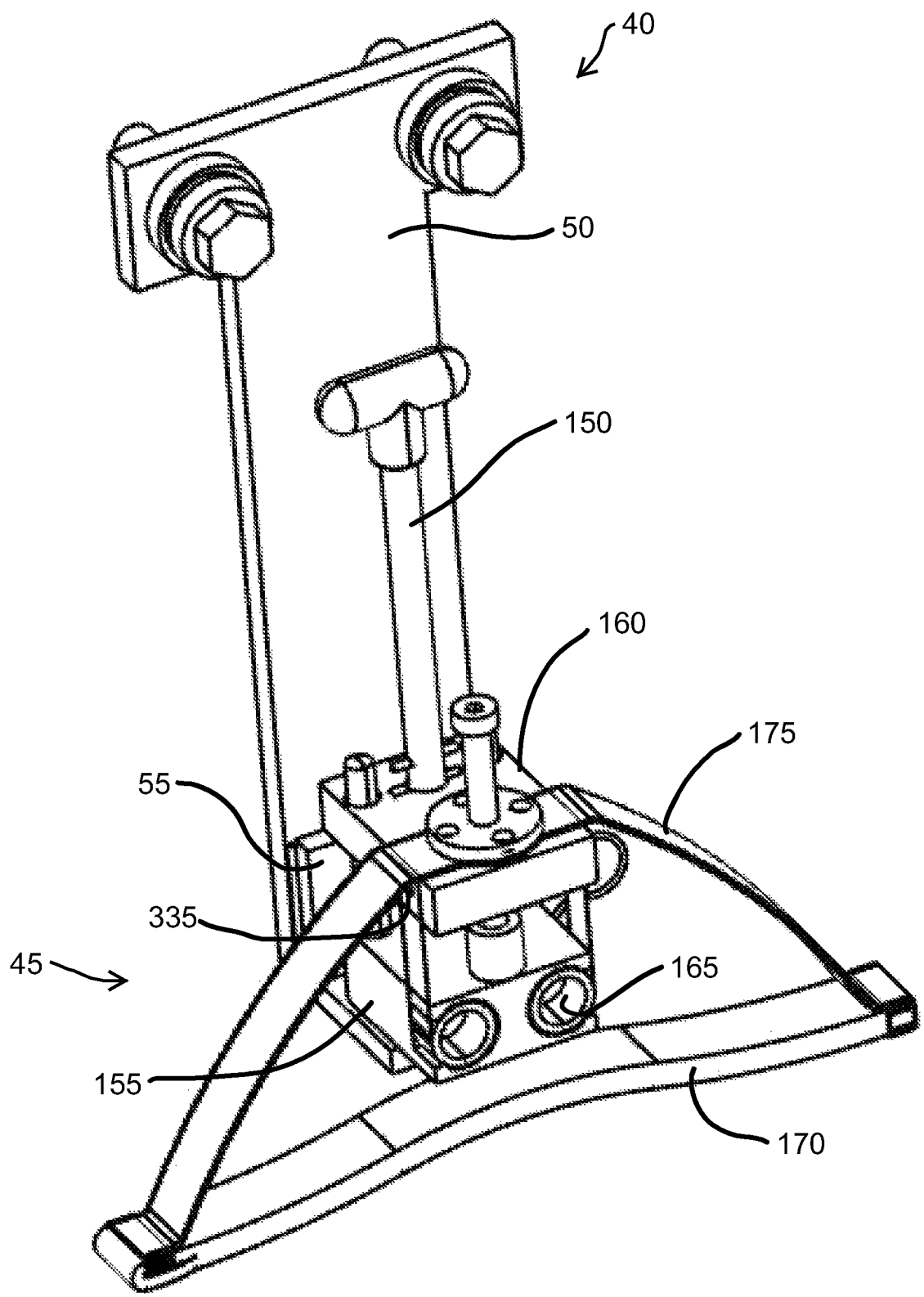
FIG. 3 is a perspective view of the generator grounding strap module of FIG. 2.

FIG. 3 illustrates one of the support brackets 40 and generator grounding modules 45 of FIG. 2. As illustrated in FIG. 3, and better illustrated in FIG. 4, the support bracket 40 includes a mounting plate 50 and a support bracket 55 attached to the mounting plate 50. The mounting plate 50 includes an elongated rectangular section 60 and two smaller rectangular extensions 65 at a first end. The smaller rectangular extensions 65 are positioned to receive fasteners 70 that facilitate the attachment of the mounting plate 50 to the stationary component 35. Other shapes or arrangements could be used for the mounting plate 50 depending upon the arrangement of the stationary component 35 to which the mounting plate 50 must attach.

The support member 55 is substantially L-shaped and includes an attachment portion 75 that attaches to the mounting plate 50 and a support portion 80 oriented at about ninety degrees to the attachment portion 75 that supports the generator grounding module 45 as will be described. With continued reference to FIG. 4, the attachment portion 75 includes a slot 85 or other apertures sized to receive fasteners 90 that facilitate the attachment of the support member 55 to the mounting plate 50. The fasteners 90 could alternatively pass through the mounting plate 50 and engage the stationary component 35 to complete the attachment of the mounting plate 50 and support member 55 to the stationary component 35 if desired. In other constructions, the fasteners 70 attaching the mounting plate 50 are the sole fasteners attached to the stationary component 35 and dowels or other alignment members are provided between the mounting plate 50 and the stationary component 35 to provide the desired positional stability of the mounting plate 50 and the support member 55.

Figure 5:
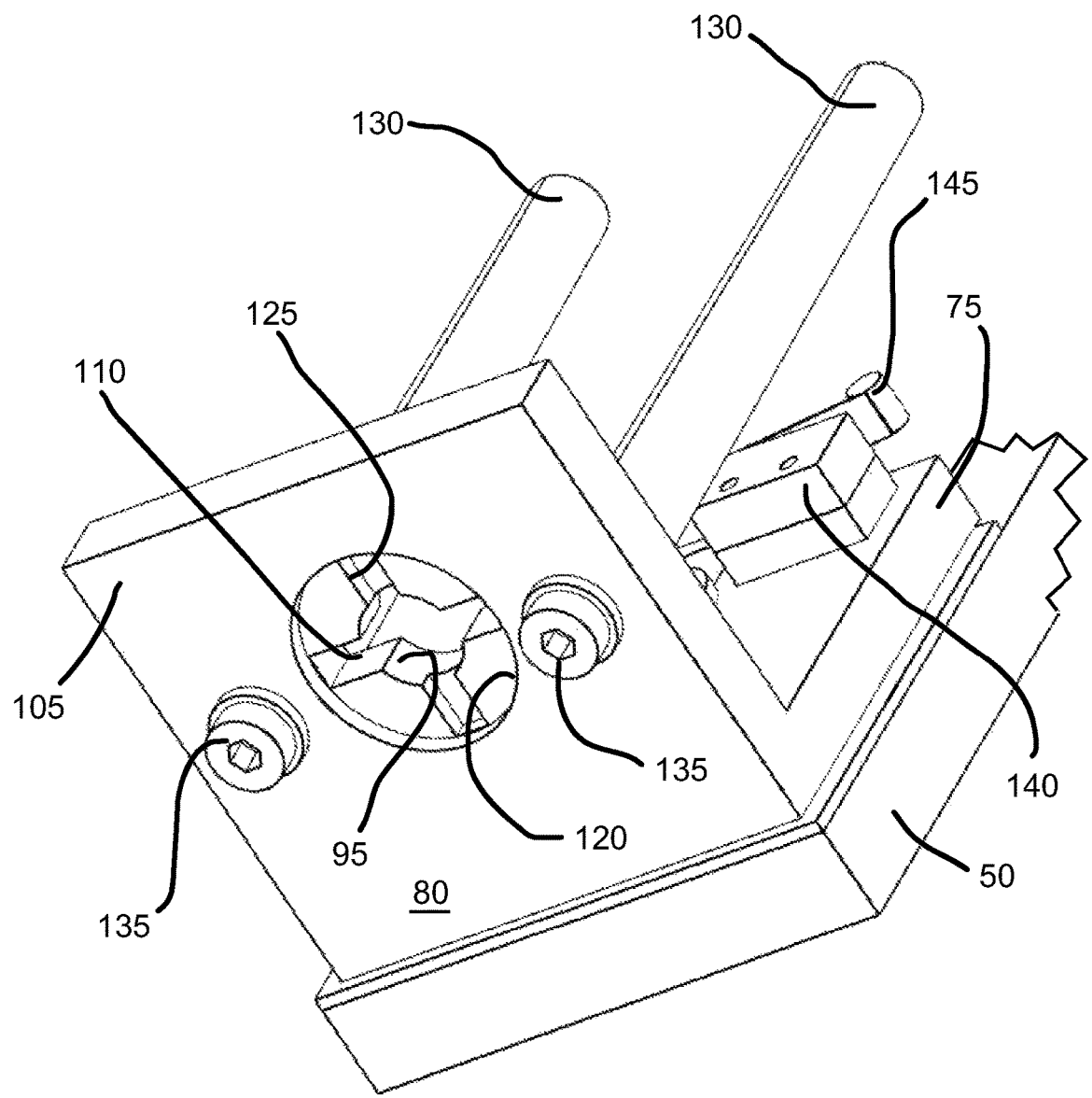
FIG. 5 is a perspective view of a portion of the support bracket of FIG. 4.

The support portion 80 of the support member 55 includes a circular aperture 95 that passes through the support portion 80 from a first surface 100 to a second surface 105 and a first slot 110 that also passes through the support portion 80. A mounting axis 115 is defined as extending along the centerline of the circular aperture 95. With reference to FIG. 5, the second surface 105 of the support portion 80 includes a larger circular counterbore 120 that extends partially through the support portion 80 and that has a diameter equal to a length of the first slot 110. A second slot 125 is arranged normal to the first slot 110, has the same length as the first slot 110, and extends partially through the support portion 80 from the surface of the counterbore 120.

Figure 4:
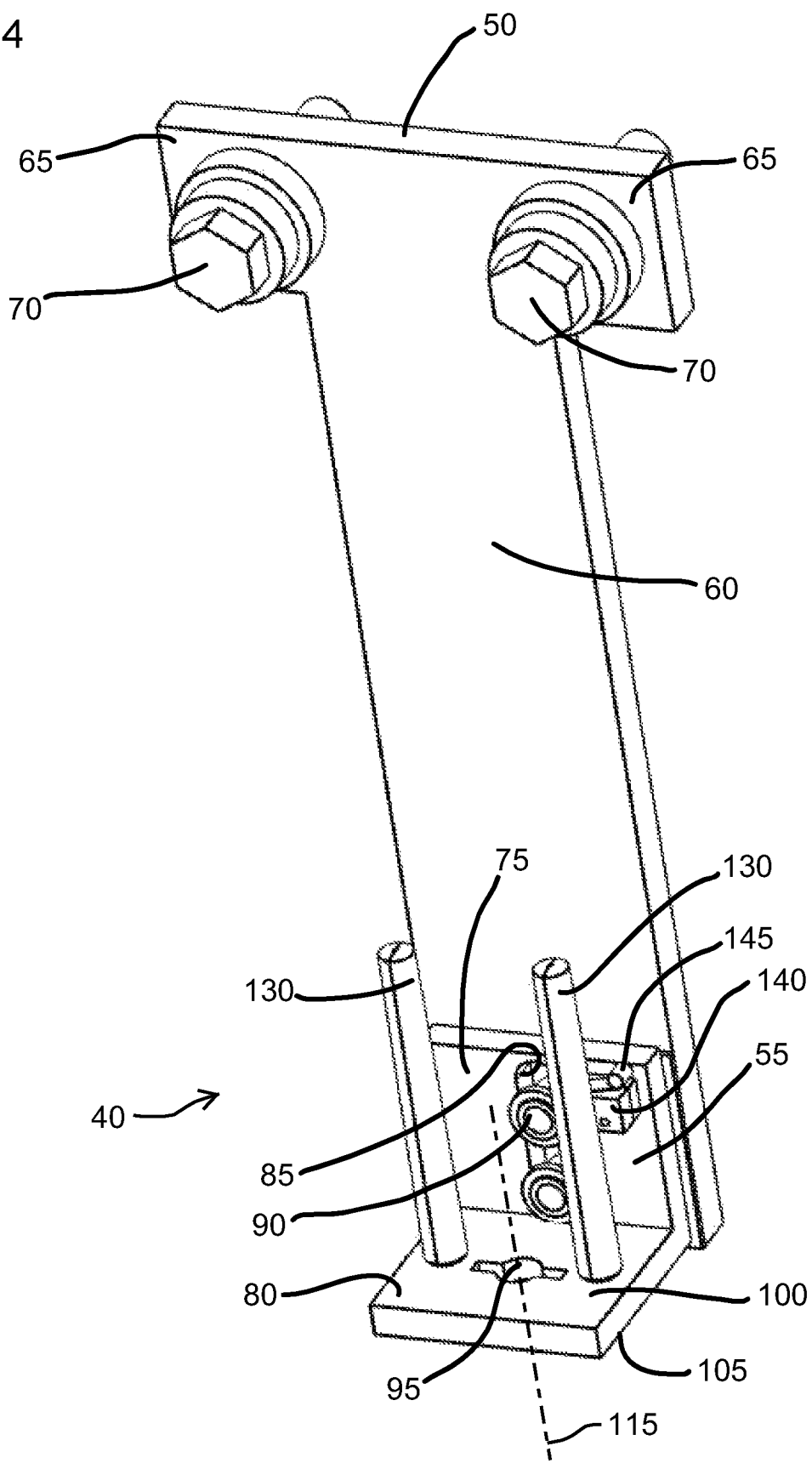
FIG. 4 is a perspective view of a support bracket for the generator grounding strap module of FIG. 3.

A pair of guide rods 130 are also visible in FIGS. 4 and 5. The guide rods 130 attach to the first surface 100 and extend parallel to the mounting axis 115 in a direction from the first surface 100 and away from the second surface 105. In the illustrated construction, fasteners 135 attach each rod 130 to the support portion 80 of the support member 55 with other attachment mechanisms being possible.

Also visible in FIGS. 4 and 5 is a sensor 140, in the form of a switch 140 or microswitch. The switch 140 is fixedly attached to the attachment portion 75 and includes an actuating arm 145 that extends from the switch 140 to a position where it can be actuated as will be discussed in greater detail below.

Figure 6:
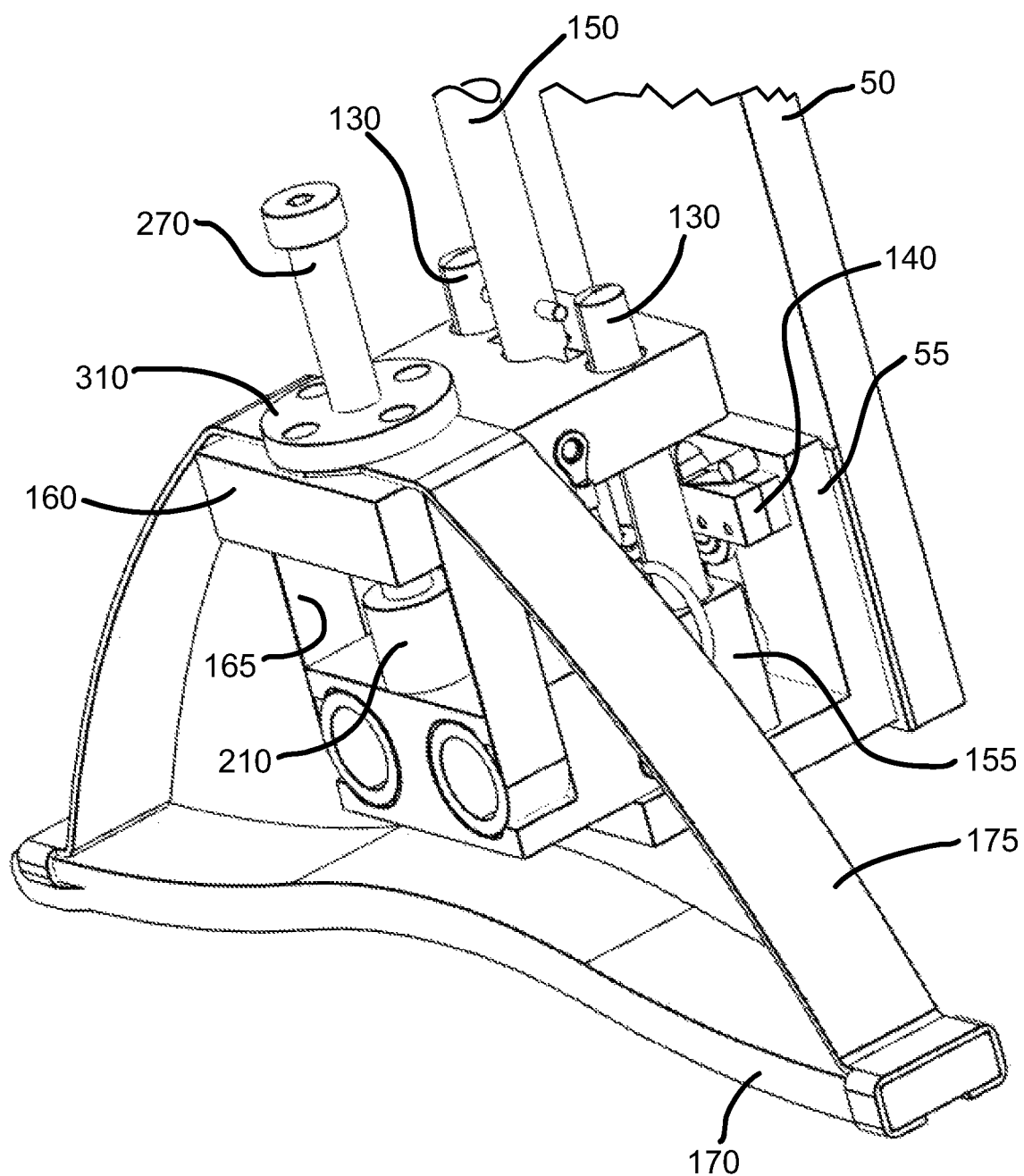
FIG. 6 is a perspective view of a portion of the grounding strap module of FIG. 3.
Figure 7:
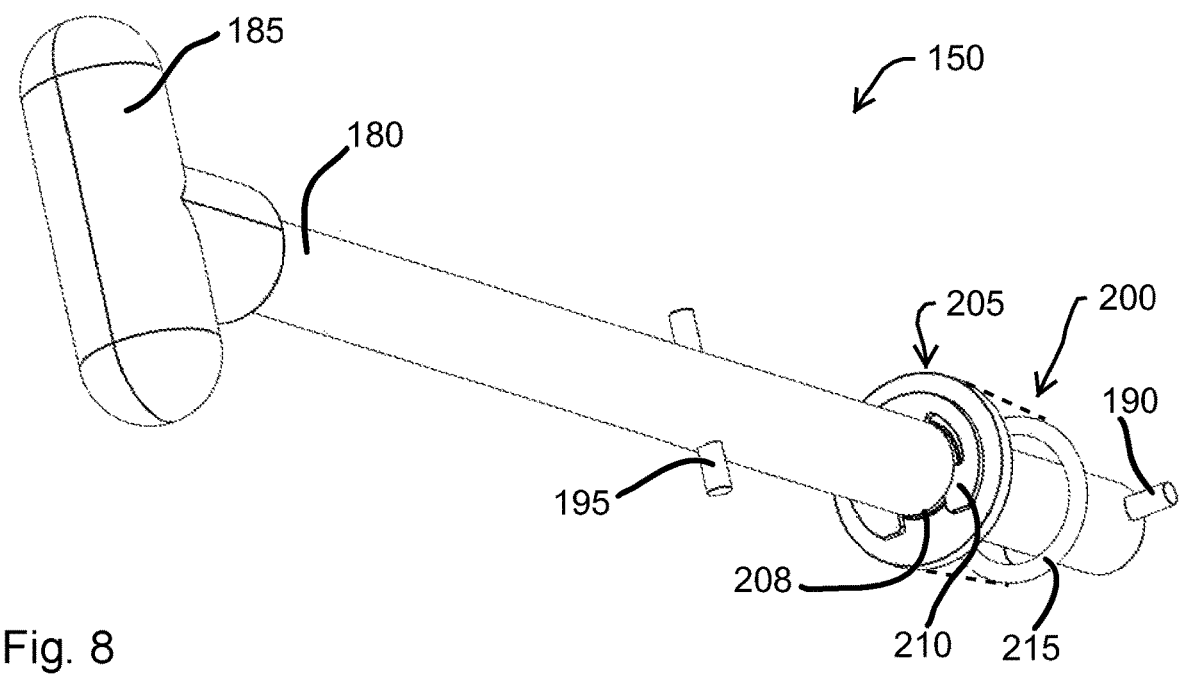
FIG. 7 is a perspective view of a handle of the grounding strap module of FIG. 3.

With reference to FIG. 6, the generator grounding module 45 includes a handle 150 (illustrated completely in FIG. 3) that extends along the mounting axis 115, a plate member 155, a mounting block 160, a biasing assembly 165, a grounding strap assembly 170, and a mounting arm 175. The handle 150, illustrated in FIG. 7 includes a shaft 180, a gripping portion 185 fixedly attached to one end of the shaft 180, a first pin 190, a second pin 195, a biasing element 200, and a locking member 205. The gripping portion 185 is sized and shaped to be easily grasped by a user to allow the user to manipulate the handle 150 and the generator grounding module 45 as required. The first pin 190 passes through the shaft 180 near a second end of the shaft 180 and is fixed with respect to the shaft 180. A roll pin or solid pin could be employed as desired and is fixed using any suitable arrangement including welding, soldering, brazing, adhesives, friction, and the like. The second pin 195 passes through the shaft 180 at a point between the gripping portion 185 and the first pin 190 and is fixed with respect to the shaft 180 much like the first pin 190. The second pin 195 is arranged normal to the first pin 190 but could be arranged at other angles if desired. In addition, the first pin 190 has a length that is less than or equal to the length of the first slot 110 and the second slot 125.

A groove 208 is formed around the shaft 180 at a first distance from the first pin 190. The groove 208 is sized and shaped to receive the locking member 205, which includes a C-clip 210 in the illustrated construction. The C-clip 210, and/or another member such as a washer, define a first stop for the biasing element 200 which includes a coil spring 215 that is disposed on the shaft 180 between the C-clip 210 and the first pin 190. In other constructions, other components could be used in place of the coil spring 215. For example, other constructions may employ a Belleville spring formed from a stack of Belleville washers with still other constructions using other components.

Figure 8:
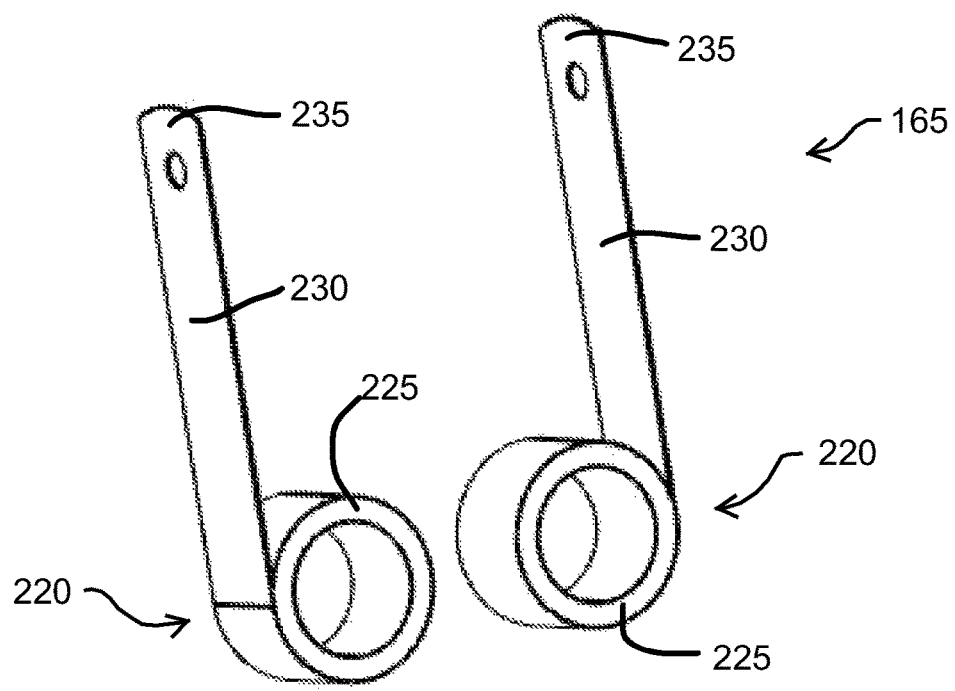
FIG. 8 is a perspective view of a biasing assembly of the grounding strap module of FIG. 3.

The biasing assembly 165, best illustrated in FIG. 8 includes two separate springs 220 formed from a coiled metal band. Each spring 220 includes a coiled portion 225, an extended portion 230, and a free end 235 with the spring 220 producing a biasing force that tends to pull the free end 235 toward the coiled portion 225. The use of coiled metal bands as springs 220 results in the biasing force of each spring 220 being substantially constant (plus or minus ten percent) regardless of the distance of the free end 235 from the coiled portion 225 (i.e., the length of the extended portion 230). Of course, the biasing force is most constant when a small percentage of the total length of the coiled metal band extends between the coiled portion 225 and the free end 235. For example, in a preferred construction the extended portion 230 of each spring 220 extends between one and three inches (25-75 mm) with at least eight to ten inches (203-255 mm) of spring 220 disposed in the coiled portion 225. Thus, the coiled portion 225 includes between about two times and ten times more of the metal band than the extended portion 230. In another construction, the coiled portion 225 includes about twelve complete coils and no more than one coil is required to move the biasing assembly 165 between a fully retracted and a fully extended position. This arrangement assures a substantially constant biasing force at all expected operating points.

Figure 9:
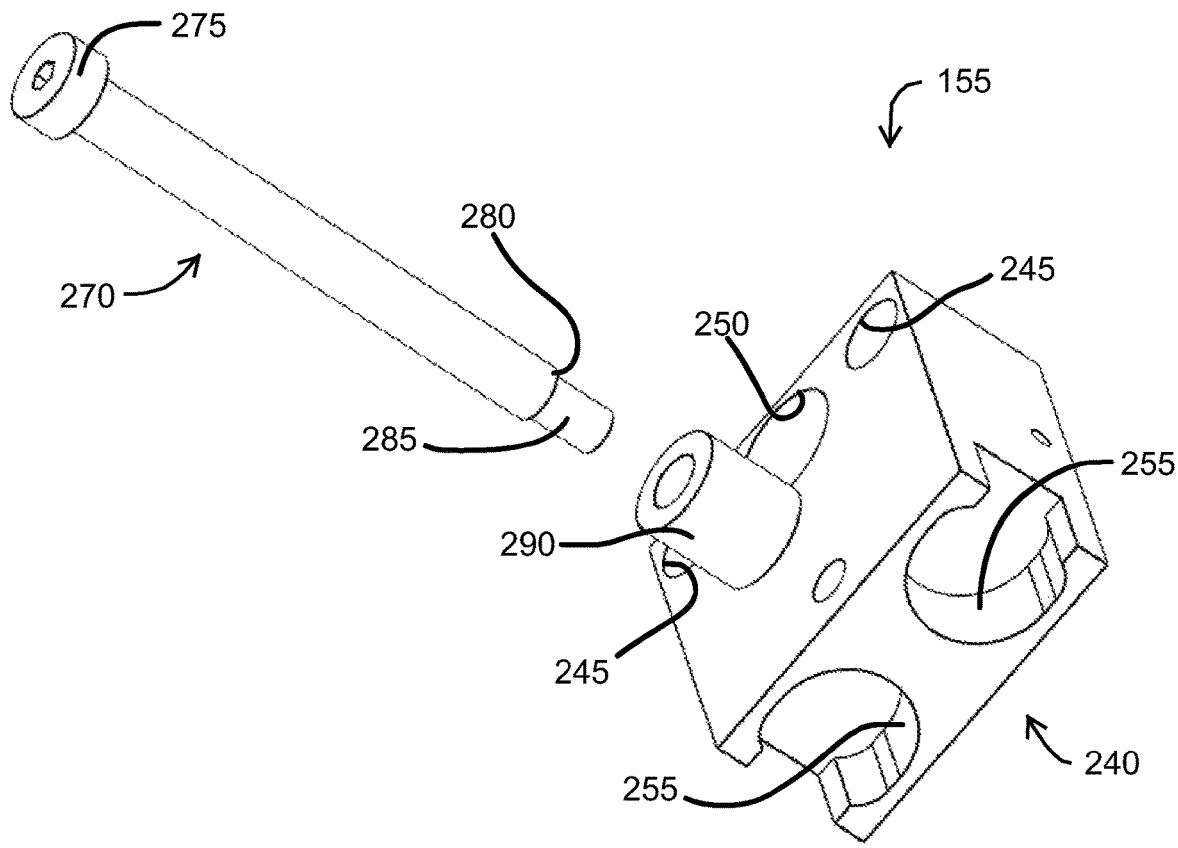
FIG. 9 is a perspective view of a plate member of the grounding strap module of FIG. 3.
Figure 10:
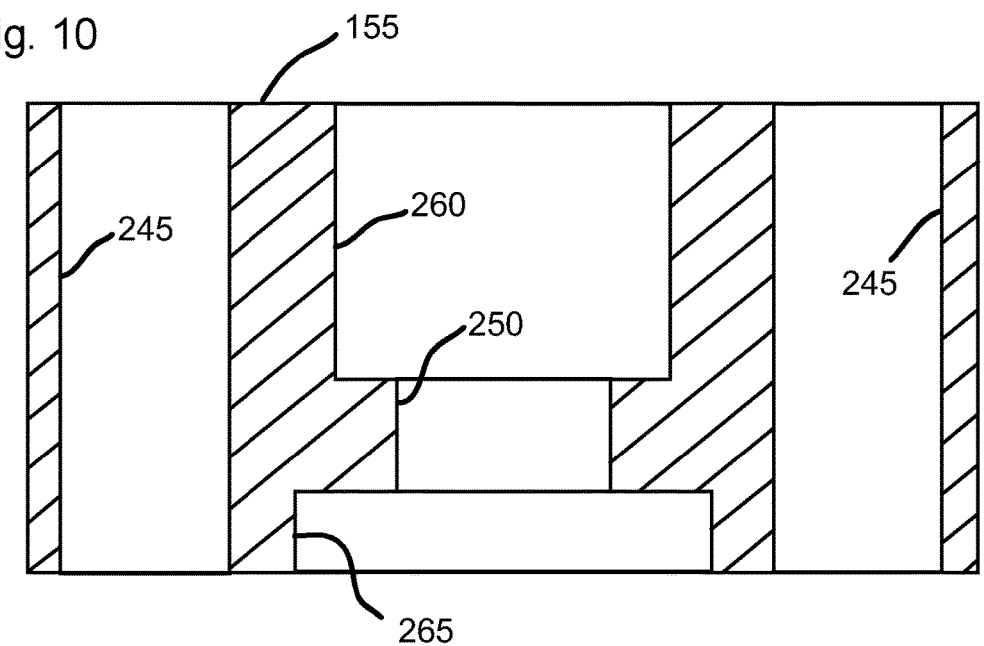
FIG. 10 is a cross-sectional view of the plate member of FIG. 9 taken along line 10-10 of FIG. 11.
Figure 11:
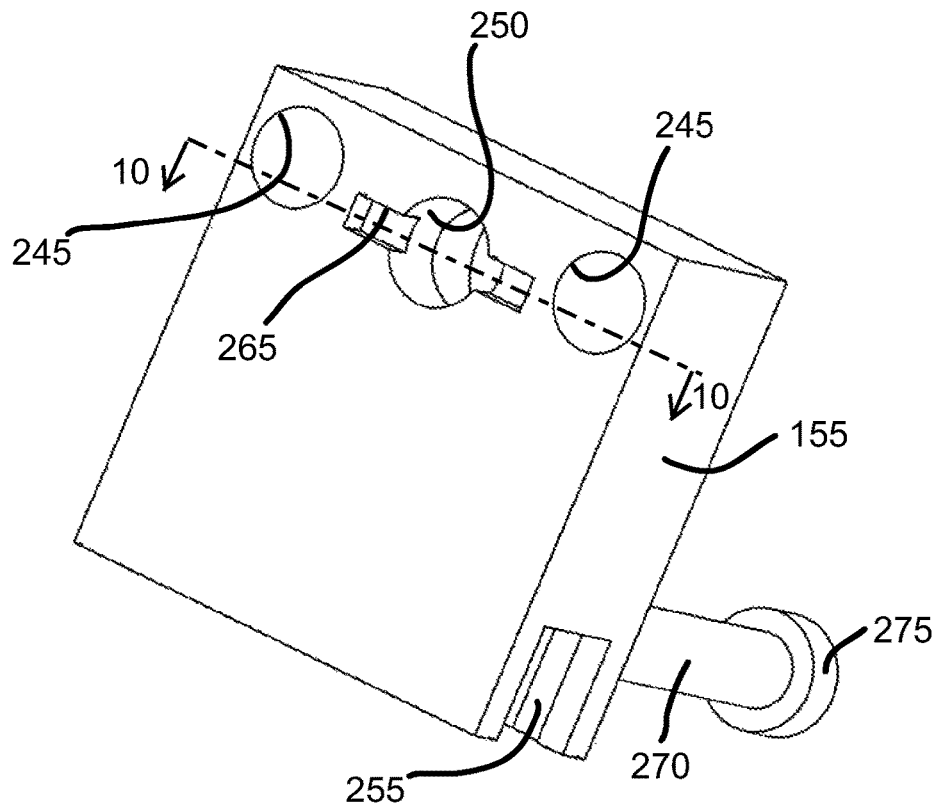
FIG. 11 is another perspective view of the plate member of FIG. 9.

FIGS. 9-11 illustrate the plate member 155 in greater detail than is visible in FIG. 3. As illustrated, the plate member 155 includes a biasing assembly mount 240, a pair of guide rod bores 245, and a first handle bore 250. The biasing assembly mount 240 includes two recesses 255 each arranged to receive one of the coiled metal springs 220 of the biasing assembly 165. More specifically, the recesses 255 are arranged to hold the coiled portion 225 and maintain it in the coiled shape while also allowing for the free end 235 and the extended portion 230 to extend from the plate member 155. In some constructions, the biasing assembly mount 240 may include a blocking element that covers the recesses 255 to inhibit the unwanted removal of the coiled portion 225 from the recesses 255.

The guide rod bores 245 are generally straight bores sized to receive the guide rods 130 while allowing the plate member 155 to move freely along the guide rods 130. The first handle bore 250, best illustrated in FIG. 10 includes a large counterbore 260 sized to receive a portion of the coil spring 215 of the handle 150. A third slot 265 is formed in the surface opposite the counterbore 260 and is sized to receive the first pin 190.

A guide screw 270 illustrated in FIGS. 9 and 11 threadably engages the plate member 155 and is fixed with respect to the plate member 155. The guide screw 270 includes an elongated screw that includes a head 275, and a shoulder 280 adjacent a threaded portion 285. The shoulder 280 is arranged to engage or partially restrain a bushing 290 or the plate member 155 to attach the bushing 290 to the plate member 155 and at least partially fix its position with regard to the plate member 155. In other constructions, the bushing 290 and/or the guide screw 270 are formed as one piece, formed as part of the plate member 155, and/or are permanently affixed to the plate member 155.

Figure 12:
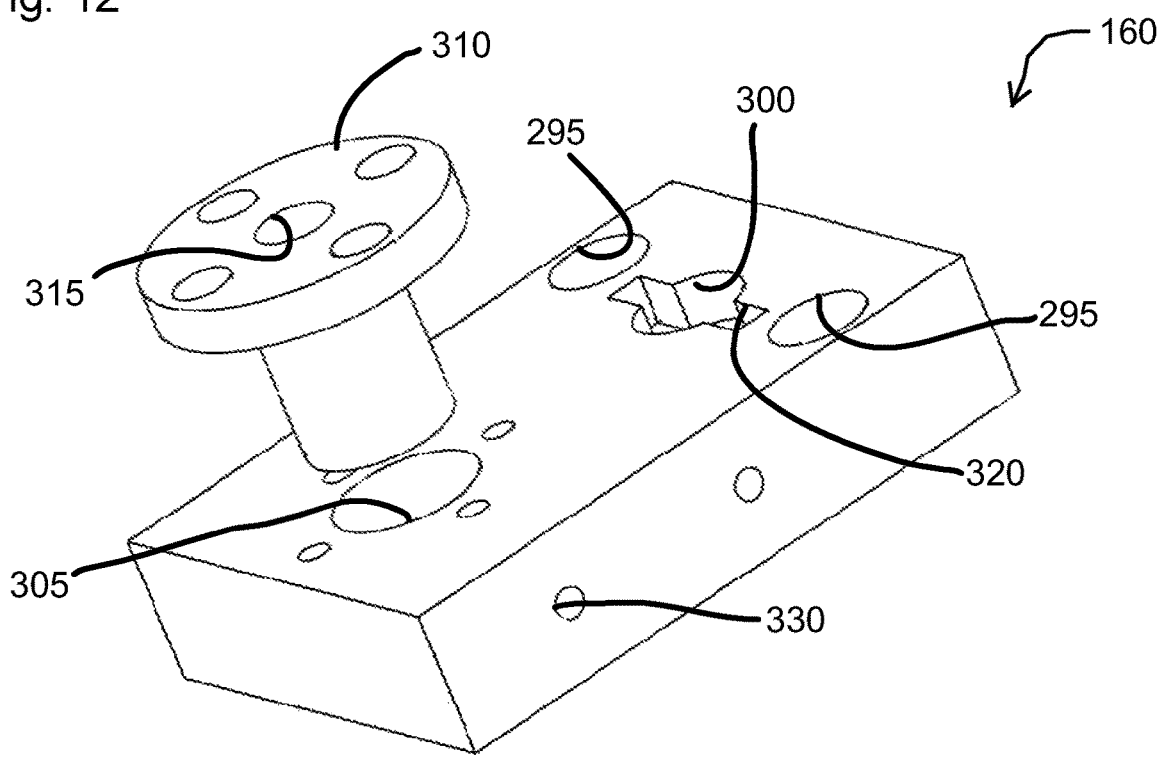
FIG. 12 is a perspective view of a mounting block of the grounding strap module of FIG. 3.
Figure 13:
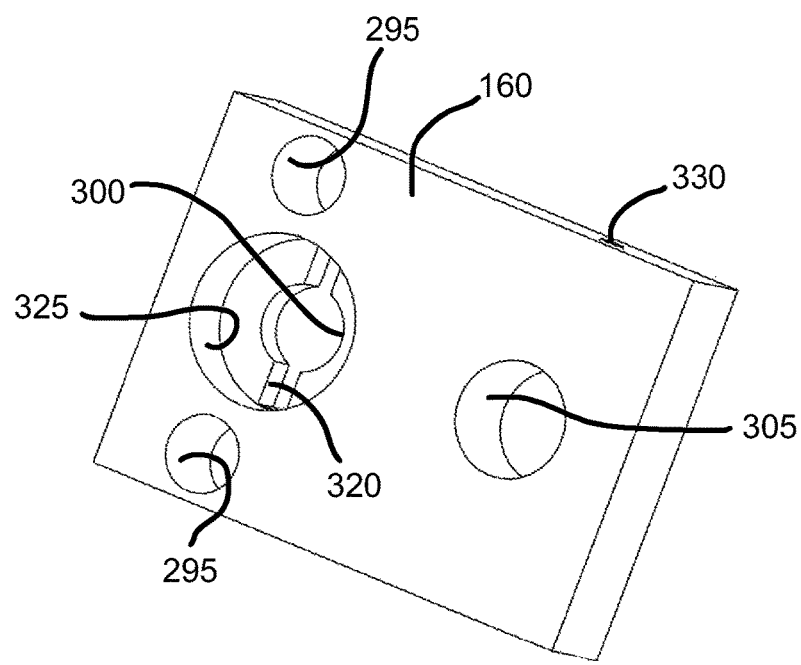
FIG. 13 is another perspective view of the mounting block of FIG. 12.

The mounting block 160 is best illustrated in FIGS. 12 and 13 and includes two guide rod bores 295, a second handle bore 300, and a bearing bore 305. The guide rod bores 295 are generally straight through bores that are sized to receive the guide rods 130 and allow free movement of the mounting block 160 with respect to the guide rods 130.

The bearing bore 305 is a straight bore that passes through the mounting block 160 and is sized to receive a bearing member 310 illustrated in FIG. 12. The bearing member 310 bolts to the mounting block 160 or is otherwise attached to fix its position with respect to the mounting block 160. The bearing member 310 preferably includes an insert or inner piece 315 that closely engages the guide screw 270 for movement of the mounting block 160 with respect to the plate member 155. The insert 315 could be a bushing, a linear bearing, or soft packing that allows for the desired linear movement while maintaining the desired alignment.

The second handle bore 300 includes a through bore sized to allow for the passage of the shaft 180 and a fourth slot 320 sized to allow for the passage of the second pin 195. The fourth slot 320 passes through the mounting block 160. As illustrated in FIG. 13, a counterbore 325 can be provided to reduce the thickness of the mounting block 160 in the area of the fourth slot 320.

Two mounting apertures 330 are provided in opposite sides of the mounting block 160 and are arranged to receive fasteners 335 that attach the free end 235 of the coiled metal springs 220 to the mounting block 160. In the illustrated construction, threaded apertures 330 are employed. However, other constructions may employ other attachment mechanisms as desired.

Figure 14:
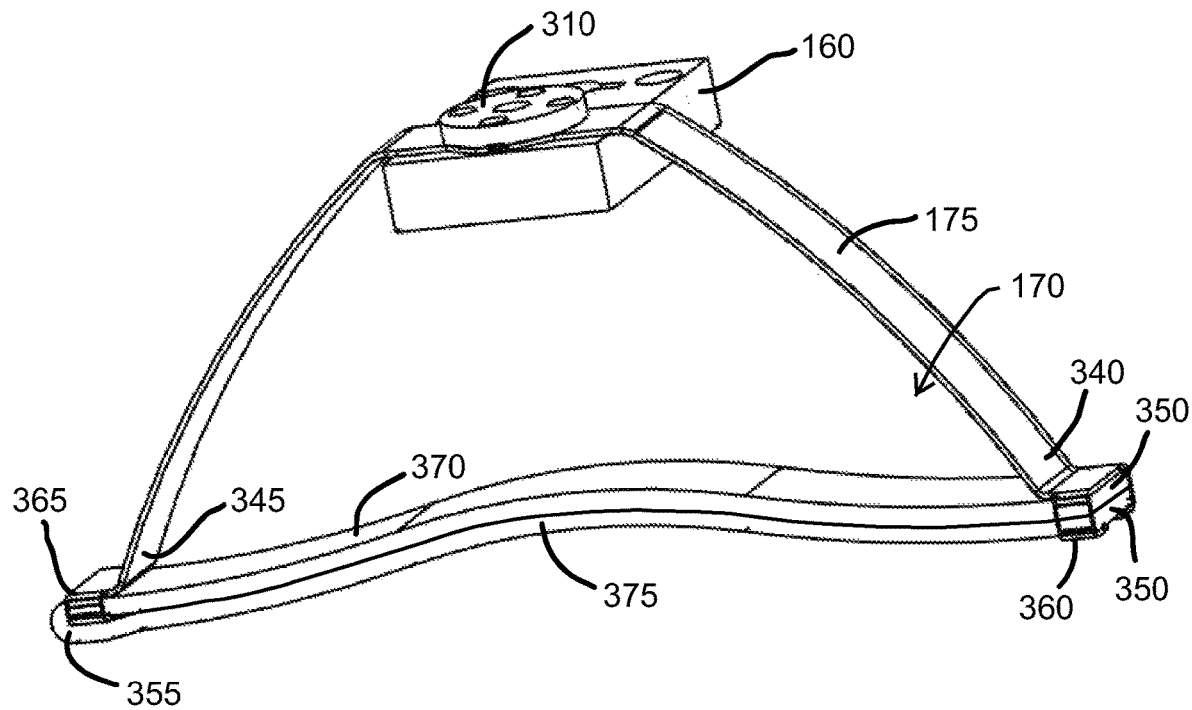
FIG. 14 is a perspective view of a mounting arm and a grounding strap assembly of the grounding strap module of FIG. 3.

As illustrated in FIG. 14, the mounting arm 175 attaches to the mounting block 160 between the mounting block 160 and the bearing member 310 and extends from the mounting block 160 to define a first end 340 and a second end 345. The mounting arm 175 is substantially bow-shaped and is formed from a metallic material such as copper, brass, bronze, steel, or aluminum, and the like. While the illustrated construction includes a one-piece mounting arm 175, other constructions may employ two or more pieces that define the mounting arm if desired. The mounting arm 175 and the grounding strap assembly 170 have a length and size that assures that when the grounding strap assembly 170 is engaged with the rotor 10, only the grounding strap assembly 170 touches the rotor 10. The mounting arm 175 remains spaced apart from the rotor 10 regardless of the position or configuration of the generator grounding module 45.

The grounding strap assembly 170 is preferably formed from a braided metal material such as copper, brass, bronze, steel, or aluminum, and the like. In one construction, a length of grounding strap material is folded onto itself such that the two free ends 350 are disposed adjacent the first end 340 of the mounting arm 175 and a loop end 355 is positioned adjacent the second end 345 of the mounting arm 175. The first end 340 of the mounting arm 175 includes a first clamp 360 that engages both free ends 350 of the folded grounding strap material. The second end 345 includes a second clamp 365 that engages a top strap 370 of the grounding strap assembly 170 before the loop 355. Attaching the grounding strap material in this way results in two separate grounding straps 370, 375 adjacent one another. In addition, if the first grounding strap 375 wore through or otherwise failed, the second grounding strap 370 would still be firmly mounted in the mounting arm 175 and could engage the rotor 10 with the desired contact pressure. The mounting arm 175, the first clamp 360, and the second clamp 365 cooperate to define an attachment assembly that supports the grounding strap assembly 170.

To assemble the support bracket 40 the user first attaches the mounting plate 50 to the stationary component 35. As is best illustrated in FIG. 2, two fasteners 70 attach one end of the mounting plate 50 to the stationary component 35. Circular protrusions 380 extending from the stationary component 35 engage the opposite end of the mounting plate 50 and act as dowels to maintain the position of the mounting plate 50. The support member 55, including the guide rods 130 and the sensor 140 are attached to the mounting plate 50 either before or after it is attached to the stationary component 35. This assembly provides a mounting point onto which the entire generator grounding module 45 can be placed or removed as desired and without the need for any special tools, processes, or procedures.

Figure 15:
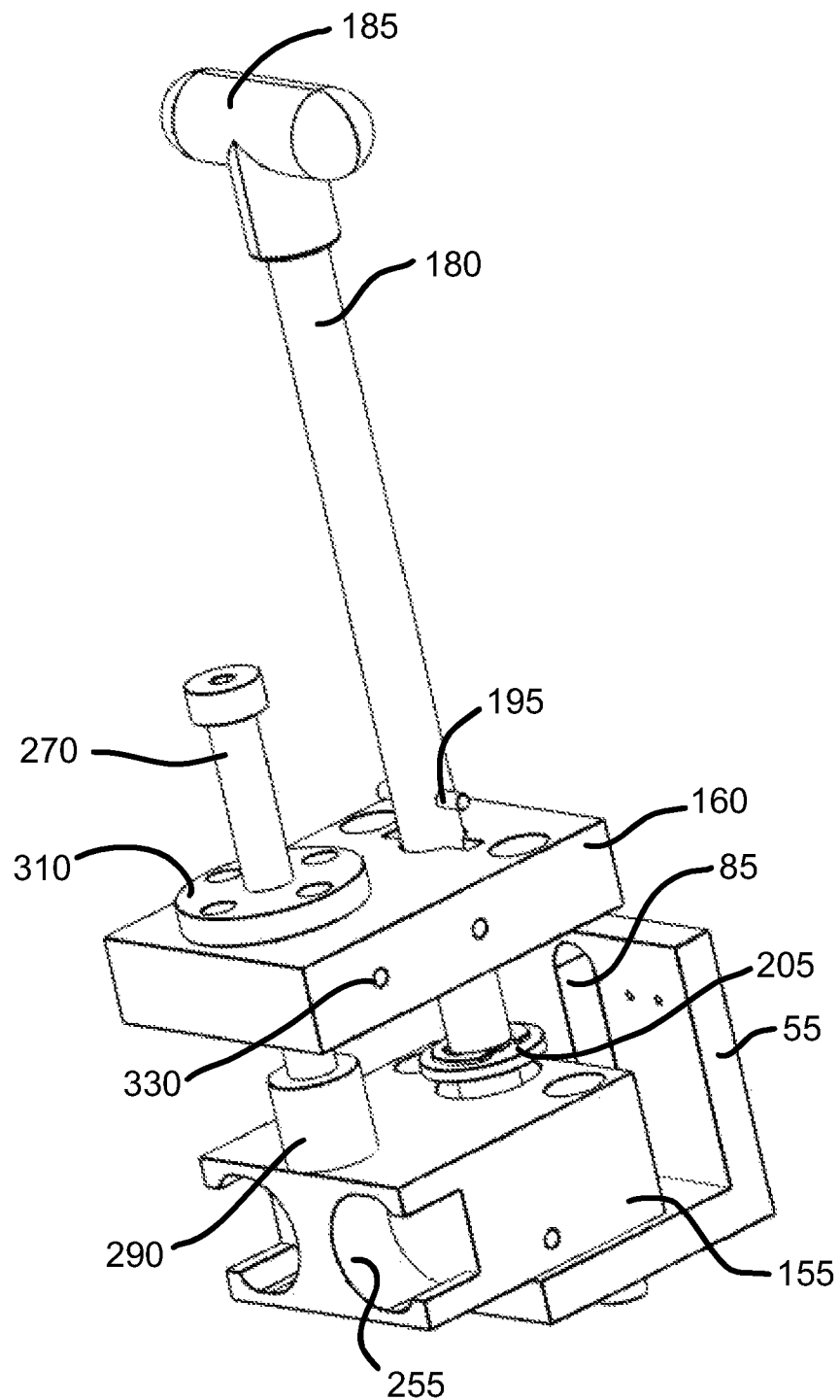
FIG. 15 is a perspective view of a partial assembly of the grounding strap module of FIG. 3.

With reference to FIG. 15, to assemble the generator grounding module 45 the user first positions the locking member 205 on the shaft 180 and positions the biasing element 200 adjacent the locking member 205. The plate member 155 is then placed on the shaft 180 with the biasing element 200 at least partially resting within the counterbore 260 of the first handle bore 250 of the plate member 155. The first pin 190 is then positioned in the shaft 180 such that the plate member 155 is trapped between the first pin 190 on one side and the biasing element 200 and the locking member 205 on the opposite side. The mounting block 160 is then positioned with the shaft 180 passing through the second handle bore 300 as illustrated in FIG. 15. The second pin 195 is then placed in the shaft 180 or was already positioned in the shaft 180 and passed freely through the second handle bore 300. The gripping portion 185 is then affixed to the end of the shaft 180 to complete the assembly of the handle 150 into the generator grounding module 45. Once the gripping portion 185 and the first pin 190 are in place, the handle 150, the plate member 155, and the mounting block 160 are connected to one another and cannot be separated without removing at least the gripping portion 185 and/or the first pin 190.

Next, the metal coil springs 220 are positioned in the respective recesses 255 with the free ends 235 extending toward and coupled to the mounting block 160 at the mounting apertures 330. Once attached, the metal coil springs 220 define the biasing assembly 165 and generate a biasing force that tends to pull the mounting block 160 toward the plate member 155. In preferred constructions, threaded fasteners attach the free ends 235 to the mounting block 160 with other attachment mechanisms being possible (e.g., pins, rivets, adhesives, welding, soldering, brazing, etc.).

To complete the assembly of the generator grounding module 45, a conductor 400 including a wire 405, two end connectors 410, and two fasteners 415 attaches to the mounting block 160 at one end and the plate member 155 at the other end. The conductor 400, best illustrated in FIG. 16 assures an electrical connection between the mounting block 160 and the plate member 155 during operation.

The grounding strap assembly 170 is attached to the mounting arm 175 as was described with regard to FIG. 14. The mounting arm 175 is then positioned adjacent the mounting block 160 and the bearing member 310 is inserted into the bearing bore 305 with the mounting arm 175 sandwiched therebetween. The bearing member 310 is fixedly attached to the mounting block 160 with fasteners that also attach the mounting arm 175 and grounding strap assembly 170 to the mounting block 160. In a preferred construction, the mounting arm 175 includes apertures that allow for the passage of the bearing member 310 and any fasteners used to attach the bearing member 310. The guide screw 270 is then inserted through the bearing member 310 and the bushing 290 and threaded into the plate member 155. The guide screw 270 provides a guide for movement of the mounting block 160 with respect to the plate member 155.

To complete the assembly, the generator grounding module 45 is attached to the support bracket 40 by passing the guide rods 130 through the guide rod bores 245, 295 in the plate member 155 and the mounting block 160 as illustrated in FIG. 3.

Figure 17:
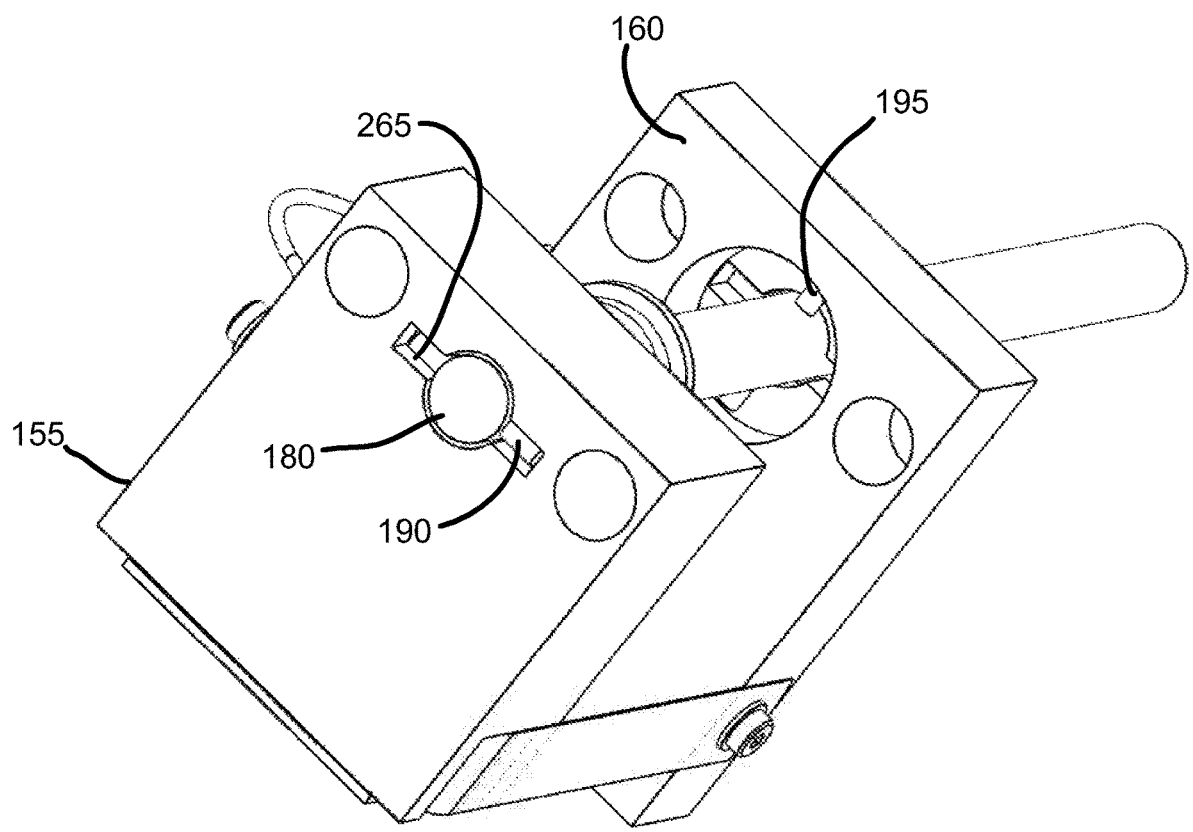
FIG. 17 is a perspective view of a portion of the generator grounding strap module of FIG. 3.

To aid or simplify the assembly, the user first manipulates the handle 150 to configure the generator grounding module 45 into a first configuration (shown in FIGS. 17 and 18) before placing the generator grounding module 45 on the guide rods 130. In the first configuration, the second pin 195 of the handle 150 is aligned with the fourth slot 320, passed through the fourth slot 320, and then the handle 150 is rotated to lock the position of the handle 150. As illustrated in FIG. 17, in this position, the second pin 195 is disposed in the counterbore 325 but is rotated 90 degrees with respect to the fourth slot 320 and is biased against the mounting block 160. The first pin 190 is disposed in the second slot 125 such that the first pin 190 and the shaft 180 do not extend below the surface of the plate member 155. In this configuration, the entire mounting block 160 is locked between the second pin 195 and the gripping portion 185 such that the mounting block 160 and the plate member 155 are at their maximum separation distance. In this position, the grounding straps 370, 375 are retracted as far from the rotor 10 as possible, and the biasing assembly 165 is fully extended.

While in this first configuration, the generator grounding module 45 is placed onto the guide rods 130 with the plate member 155 being free to slide into contact with the support portion 80 of the support member 55. This configuration also advantageously pre-aligns the first pin 190 with the first slot 110 which allows the user to simply push the shaft 180 toward the support member 55 in order to move the first pin 190 through the first slot 110.

Figure 19:
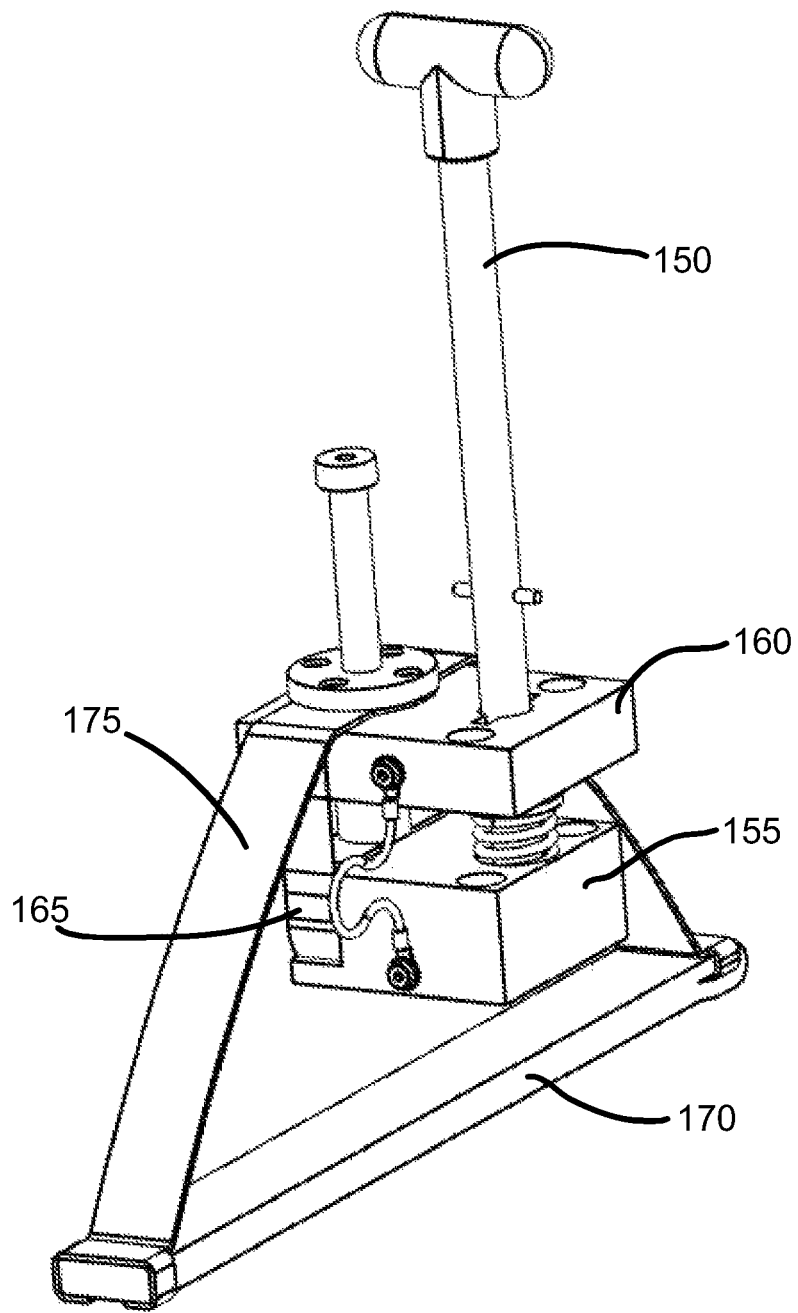
FIG. 19 is a perspective view of a portion of the generator grounding strap module of FIG. 3 in a second configuration.

In a second, or operational configuration shown in FIG. 19, the second pin 195 of the handle 150 is disposed between the gripping portion 185 and the mounting block 160. In this position, the biasing assembly 165 pulls the plate member 155 and the mounting block 160 to their closest possible position, thereby pulling the biasing assembly 165 to its most retracted position. One of the bushing 290 and the coil spring 215, both positioned between the mounting block 160 and the plate member 155, engages both the plate member 155 and the mounting block 160 to stop any additional movement and define the closest position between the mounting block 160 and the plate member 155.

To move the generator grounding module 45 from the first configuration to the second or operational configuration, the user first positions the generator grounding module 45 in the first configuration and places it on the guide rods 130 until the plate member 155 contacts the support member 55.

Figure 16:
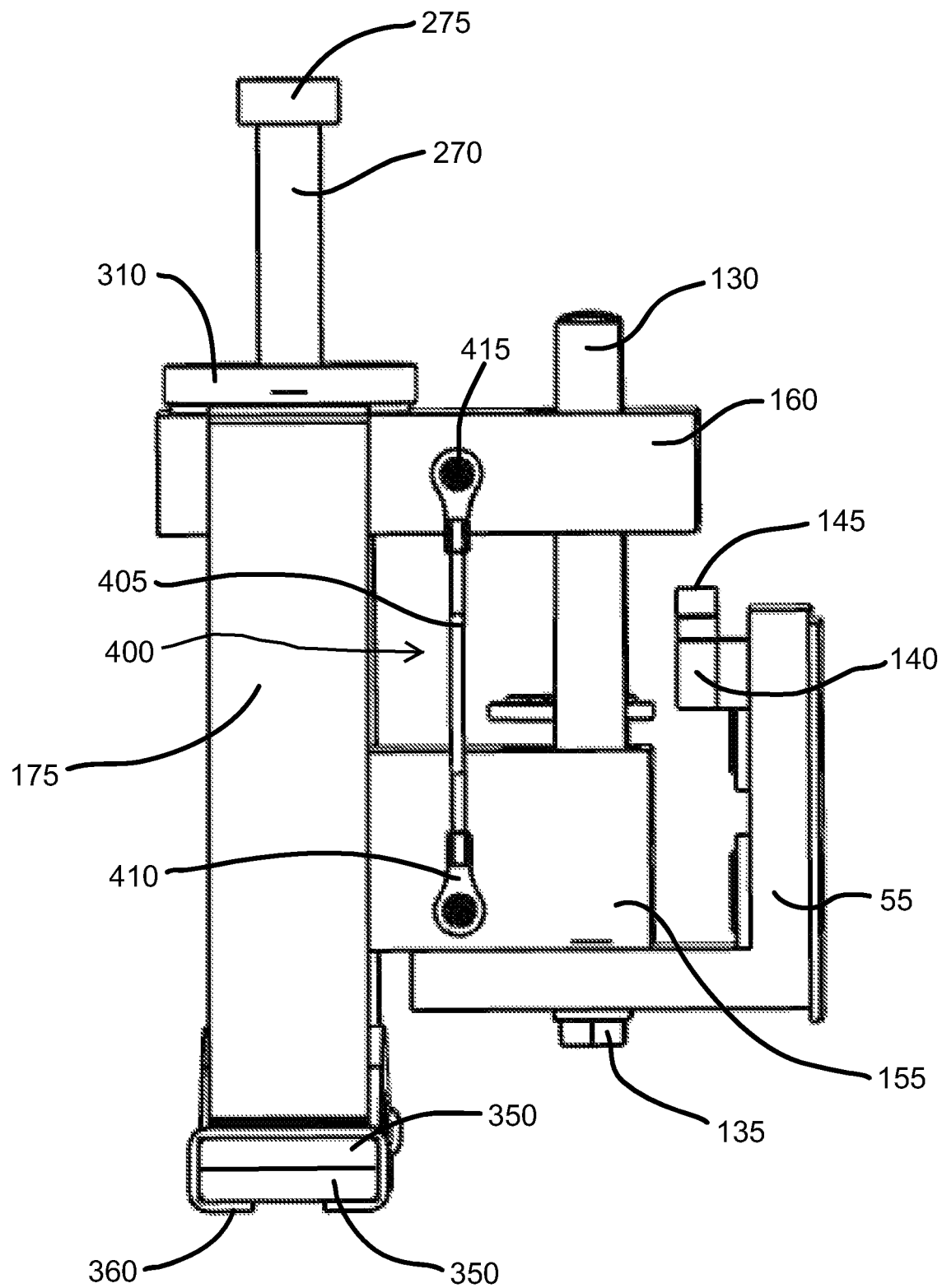
FIG. 16 is a side view of a portion of the grounding strap module of FIG. 3 in an engaged position.
Figure 18:
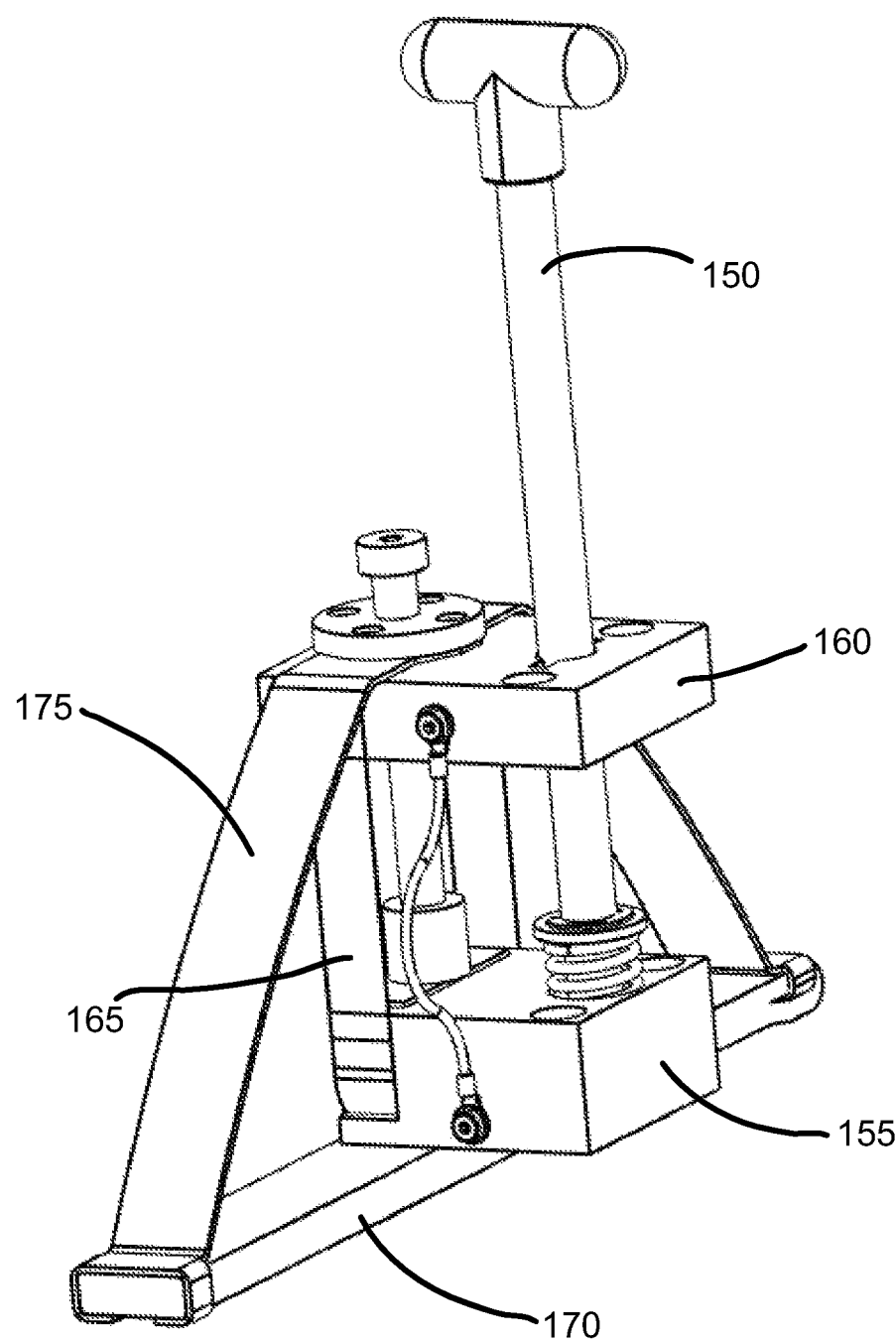
FIG. 18 is a perspective view of a portion of the generator grounding strap module of FIG. 3 in a first configuration.

To move the generator grounding module 45 into operational engagement with the rotor 10 (i.e., engaged with the desired contact pressure between the straps 370, 375 and the rotor 10), the user starts with the generator grounding module 45 in the first configuration illustrated in FIGS. 17 and 18. In this configuration, the shaft 180 is positioned such that the first pin 190 is aligned with the first slot 110. The second pin 195 is preferably oriented at a ninety-degree angle with respect to the first pin 190 and can be used as a guide to properly orient the shaft 180. The user next pushes the shaft 180 toward the plate member 155. The locking member 205 and spring 215 push the plate member 155 into engagement with the support portion 80 of the support member 55. Further pressure compresses the coil spring 215 against the plate member 155 and allows the user to push the shaft 180 until the first pin 190 passes through the first slot 110 and is disposed in the counterbore 120 of the support portion 80. The user then rotates the shaft 180 ninety degrees such that the first pin 190 engages the second slot 125 and the coil spring 215 holds the plate member 155 against the support member 55. The rotation of the handle 150 also aligns the second pin 195 with the fourth slot 320 which allows the biasing assembly 165 to pull the mounting block 160 toward the plate member 155 with a desired constant biasing force as the second pin 195 passes through the fourth slot 320. However, before the mounting block 160 reaches the fully retracted position (i.e., the second configuration shown in FIG. 19), the grounding strap assembly 170 contacts the rotor 10 and generates a force in the mounting arm 175 that opposes the biasing force. Once these forces are balanced, the generator grounding module 45 has reached an operating position in which the grounding strap assembly 170 is in contact with the rotor 10 with a desired contact pressure as illustrated in FIG. 16. In the operating position, the mounting block 160 is still spaced a non-zero distance from the actuating arm 145 of the switch 140.

Once the grounding strap 170 contacts the rotor 10, a grounding path is fully established. The grounding path begins at the grounding strap 170 and flows into the mounting arm 175. From the mounting arm 175, any current flows into the mounting block 160, through the conductor 400 into the plate member 155, and finally into the support member 55. The support member 55 can be grounded to the stationary component 35 by the fasteners or an additional wire, or the grounding path can continue via wire to a current measuring device for monitoring.

During operation, the rotor 10 tends to wear the grounding strap 375 in contact with the rotor 10 to the point that the strap 375 will fail. The arrangement of the grounding strap assembly 170 does provide a second grounding strap 370 that engages the rotor 10 upon failure of the first strap 375. The first grounding strap 375 engages the rotor 10 in a position that is maintained by the balance of the forces between the mounting arm 175 and the biasing assembly 165. When the first grounding strap 375 fails, the force produced by the mounting arm 175 will drop as the desired contact pressure is no longer being maintained. The biasing force produced by the biasing assembly 165 remains constant and thus causes the mounting block 160 to move toward the plate member 155 until the second grounding strap 370 contacts the rotor 10 and the forces produced by the biasing assembly 165 and the mounting arms 175 are again balanced.

With reference to FIG. 16, movement of the mounting block 160 toward the plate member 155 could be measured or an indication of that movement could be provided. For example, the length of the guide screw 270 above the mounting block 160 could be periodically measured, with any increase in the measurement indicating that the first grounding strap 375 has failed. In other constructions, the guide screw 270 could include a colored strip that is hidden below the mounting block 160 when both grounding straps 370, 375 are intact. The colored strip would become visible upon failure of the first grounding strap 375. A second color could be provided to indicate when both straps 370, 375 have failed.

As discussed above, the sensor 140 is provided in the form of the switch 140 and can be used to indicate when both grounding straps 370, 375 have failed. Upon failure of the second grounding strap 370, the biasing assembly 165 will pull the mounting block 160 toward the plate member 155 to the fully retracted position. In this position, the mounting block 160 contacts and actuates the actuating arm 145 of the switch 140. The switch 140 can be connected to an indicator (e.g., a visual device such as a light, an audible device such as an alarm, etc.) or to a control system to provide an immediate indication, upon actuation of the actuating arm 145, that both grounding straps 370, 375 have failed.

In another construction, the sensor 140 includes a position measuring sensor such as an RVDT or LVDT that can accurately measure position changes. These sensors 140 can provide signals when the position changes by more than a fixed amount to indicate the failure of the first grounding strap 375 and the second grounding strap 370. In still other constructions, non-contact sensors such as Hall effect sensors and the like could be employed to detect movement of the mounting block 160 with respect to the plate member 155.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. A generator grounding module selectively mountable to a support bracket and selectively engageable with a rotor, the generator grounding module comprising:
    a plate member movable along a mounting axis to selectively attach the generator grounding module to the support bracket,
    the plate member movable between a first position and a second position in which the plate member is fixed with respect to the support bracket;
    a mounting block movable along the mounting axis with respect to the plate member;
    a grounding strap coupled to the mounting block and movable between a disengaged position and an engaged position in which the grounding strap contacts the rotor;
    a biasing assembly connected to the plate member and the mounting block and operable to bias the mounting block along the mounting axis toward the plate member,
    wherein the plate member is fixedly attached to the support bracket when in the second position and the biasing assembly biases the grounding strap into the engaged position; and
    a sensor positioned to detect displacement of the mounting block toward the plate member when the plate member is in the first position,
    wherein the sensor includes a switch positioned to be activated in response to a failure of the grounding strap, and
    wherein the mounting axis is a radial axis of the rotor.

2. The generator grounding module of claim 1, further comprising a mounting arm fixedly attached to the mounting block and defining a first end and a second end spaced apart from the first end, the grounding strap attached to the first end and the second end.

3. The generator grounding module of claim 2, wherein the mounting arm includes a first arm that defines the first end and a separate second arm that defines the second end.

4. The generator grounding module of claim 2, further comprising a second grounding strap attached to the first end and the second end and spaced a non-zero distance in the mounting direction from the grounding strap.

5. The generator grounding module of claim 4, further comprising a sensor positioned to generate a signal in response to a failure of the grounding strap and the second grounding strap.

6. The generator grounding module of claim 1, wherein the biasing assembly includes a biasing member that applies a constant biasing force to the mounting block as the mounting block moves between the disengaged position and the engaged position.

7. The generator grounding module of claim 6, wherein the biasing member includes a coiled metal band having a coiled end attached to the plate member and a free end attached to the mounting block.

8. The generator grounding module of claim 1, further comprising a handle coupled to the plate member and operable to move the plate member along the mounting axis between the first position and the second position.

9. The generator grounding module of claim 8, wherein the handle includes a locking member selectively engageable with the support bracket to lock the plate member in the second position.

10. The generator grounding module of claim 1, wherein the grounding strap is formed from a braided metal.

11. A generator grounding module selectively mountable to a support bracket and selectively engageable with a rotor, the generator grounding module comprising:
- a mounting block movable along a mounting axis with respect to the support bracket;
- a first grounding strap;
- a second grounding strap;
- an attachment assembly operable to connect the first grounding strap and the second grounding strap to the mounting block,
- the mounting block movable between a disengaged position and an engaged position in which the first grounding strap contacts the rotor and the second grounding strap is spaced apart from the rotor;
- a biasing assembly connected to the support bracket and the mounting block and operable to bias the mounting block along the mounting axis toward the rotor,
- wherein the biasing assembly biases the first grounding strap into the engaged position;
- a plate member movable along the mounting axis between a first position and a second position in which the plate member is fixed with respect to the support bracket; and
- a sensor positioned to detect displacement of the mounting block toward the plate member when the plate member is in the first position,
- wherein the sensor includes a switch positioned to be activated in response to a failure of the grounding strap, and wherein the mounting axis is a radial axis of the rotor.

12. The generator grounding module of claim 11, further comprising a mounting arm fixedly attached to the mounting block and defining a first end and a second end spaced apart from the first end, the first grounding strap and the second grounding strap attached to the first end and the second end and spaced a non-zero distance in the mounting direction from the first grounding strap.

13. The generator grounding module of claim 12, wherein the mounting arm includes a first arm that defines the first end and a separate second arm that defines the second end.

14. The generator grounding module of claim 11, further comprising a sensor positioned to generate a signal in response to a failure of the first grounding strap and the second grounding strap.

15. The generator grounding module of claim 11, wherein the biasing assembly includes a biasing member that applies a constant biasing force to the mounting block as the mounting block moves between the disengaged position and the engaged position.

16. The generator grounding module of claim 15, wherein the biasing member includes a coiled metal band having a coil end attached to the plate member and a free end attached to the mounting block.

17. The generator grounding module of claim 11, further comprising a handle coupled to the plate member and operable to move the plate member along the mounting axis between the first position and the second position.

18. The generator grounding module of claim 17, wherein the handle includes a locking member selectively engageable with the support bracket to lock the plate member in the second position.

\* \* \* \* \*